US012622036B2

(12) United States Patent

Tatsumi et al.

(10) Patent No.: US 12,622,036 B2

(45) Date of Patent: May 5, 2026

(54) SEMICONDUCTOR DEVICE

(71) Applicant: Sumitomo Electric Industries, Ltd., Osaka (JP)

(72) Inventors: Taizo Tatsumi, Osaka (JP); Masahiro Tanomura, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 442 days.

(21) Appl. No.: 18/480,154

(22) Filed: Oct. 3, 2023

(65) Prior Publication Data

US 2024/0120396 A1 Apr. 11, 2024

(30) Foreign Application Priority Data

Oct. 7, 2022 (JP) ................................. 2022-162621

(51) Int. Cl.
| | |
|---|---|
| *H10D 64/27* | (2025.01) |
| *H10D 30/63* | (2025.01) |
| *H10D 64/23* | (2025.01) |
| *H10D 84/82* | (2025.01) |

(52) U.S. Cl.
CPC ........... *H10D 64/512* (2025.01); *H10D 30/63* (2025.01); *H10D 64/258* (2025.01); *H10D 84/82* (2025.01)

(58) Field of Classification Search
CPC ..... H10D 62/102; H10D 84/82; H10D 64/512
See application file for complete search history.

(56) References Cited

U.S. PATENT DOCUMENTS

| | | | | |
|---|---|---|---|---|
| 9,786,660 | B1 * | 10/2017 | Farrell | .................. H10D 84/83 |
| 2002/0140024 | A1 | 10/2002 | Aoki et al. | |
| 2012/0018735 | A1 | 1/2012 | Ishii | |
| 2025/0096137 | A1 * | 3/2025 | Tatsumi | .............. H10D 64/111 |
| 2025/0157912 | A1 * | 5/2025 | Mori | ................ H01L 23/49844 |

FOREIGN PATENT DOCUMENTS

| | | |
|---|---|---|
| JP | 2002-299351 A | 10/2002 |
| JP | 5649347 A | 1/2015 |

* cited by examiner

*Primary Examiner* — Yu-Hsi D Sun
(74) *Attorney, Agent, or Firm* — Volpe Koenig

(57) ABSTRACT

A semiconductor device includes a substrate, a source electrode, a drain electrode, a first gate electrode extending in a first direction and provided between the source electrode and the drain electrode, a second gate electrode provided in a region between the source electrode and the drain electrode positioned in the first direction from the first gate electrode, a gate pad provided so as to dispose the first gate electrode between the gate pad and the second gate electrode, and electrically connected to the first gate electrode, a first gate line provided above the source electrode, a second gate line provided above the source electrode and extending in a second direction that crosses the first direction, and a first guard metal layer provided between the second gate line and the drain electrode, and having at least a portion provided between the drain electrode and the source electrode.

10 Claims, 17 Drawing Sheets

SEMICONDUCTOR DEVICE

CROSS REFERENCE TO RELATED APPLICATIONS

This application claims priority based on Japanese Patent Application No. 2022-162621 filed on Oct. 7, 2022, and the entire contents of the Japanese patent application are incorporated herein by reference.

TECHNICAL FIELD

The present disclosure relates to a semiconductor device.

BACKGROUND

In a field effect transistor (FET) having finger-shaped source electrodes, gate electrodes, and drain electrodes, it is known that a plurality of unit FETs each having a source electrode, a gate electrode, and a drain electrode are arranged in an extending direction of the electrodes (for example, PTL 1: Japanese Unexamined Patent Application Publication No. 2002-299351, PTL 2: U.S. Pat. No. 9,786, 660).

SUMMARY

An embodiment of the present disclosure is about a semiconductor device includes, a substrate, a source electrode extending in a first direction and provided on the substrate, a drain electrode extending in the first direction and provided on the substrate, a first gate electrode extending in the first direction and provided on the substrate between the source electrode and the drain electrode, a second gate electrode extending in the first direction and provided in a region on the substrate that is between the source electrode and the drain electrode and that is positioned in the first direction from the first gate electrode, a gate pad provided so as to dispose the first gate electrode between the gate pad and the second gate electrode, and electrically connected to the first gate electrode, a first gate line provided above the source electrode and opposite to the substrate with respect to the source electrode, and extending in the first direction, a second gate line provided above the source electrode, extending in a second direction that crosses the first direction, having a first end connected to the first gate line, and having a second end opposite to the first end, the second end being electrically connected to the second gate electrode outside the source electrode, and a first guard metal layer provided between the second gate line and the drain electrode, and having at least a portion provided between the drain electrode and the source electrode, the first guard metal layer being electrically connected to the source electrode.

DETAILED DESCRIPTION

Figure 1:
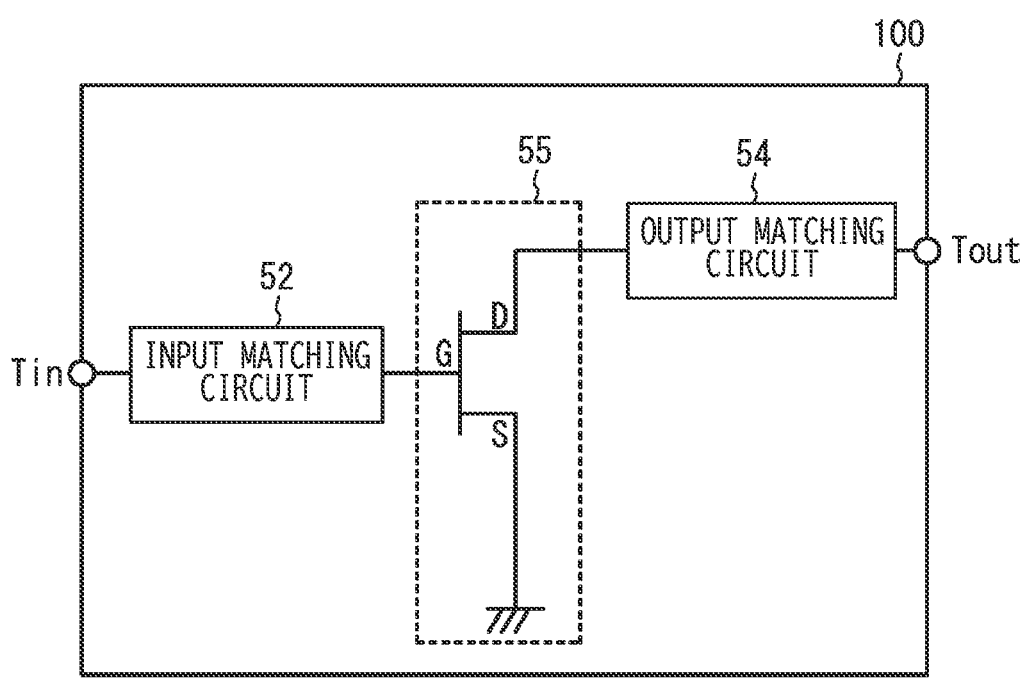
FIG. 1 is a block diagram of an amplifier using an FET according to a first embodiment.

In each of the PTLs 1 and 2, the width of the gate electrode in the unit FET can be reduced by arranging a plurality of unit FETs in the extending direction of the electrode. Therefore, a gate resistance can be suppressed. However, a gate line that electrically connects a gate pad and a gate electrode away from the gate pad is provided above the unit FET. At a position where the gate line approaches the drain electrode, a parasitic capacitance between the gate line and the drain electrode is increased, and characteristics such as gain are deteriorated.

The present disclosure has been made in view of the above problems, and an object of the present disclosure is to suppress deterioration of characteristics.

DETAILS OF EMBODIMENTS OF PRESENT DISCLOSURE

First, the contents of embodiments of the present disclosure will be listed and explained.

(1) A semiconductor device includes, a substrate, a source electrode extending in a first direction and provided on the substrate, a drain electrode extending in the first direction and provided on the substrate, a first gate electrode extending in the first direction and provided on the substrate between the source electrode and the drain electrode, a second gate electrode extending in the first direction and provided in a region on the substrate that is between the source electrode and the drain electrode and that is positioned in the first direction from the first gate electrode, a gate pad provided so as to dispose the first gate electrode between the gate pad and the second gate electrode, and electrically connected to the first gate electrode, a first gate line provided above the source electrode and opposite to the substrate with respect to the source electrode, and extending in the first direction, a second gate line provided above the source electrode, extending in a second direction that crosses the first direction, having a first end connected to the first gate line, and having a second end opposite to the first end, and the second end being electrically connected to the second gate electrode outside the source electrode, and a first guard metal layer provided between the second gate line and the drain electrode, and having at least a portion provided between the drain electrode and the source electrode, the first guard metal layer being electrically connected to the source electrode. Thus, the gate-drain capacitance can be suppressed, so that deterioration of characteristics can be suppressed.

(2) In the above (1), the first guard metal layer may be provided so as to surround a portion of the second gate line positioned outside the source electrode from the first direction, a direction opposite to the first direction, and the second direction.

(3) In the above (2), the first guard metal layer may have a first end electrically connected to the source electrode in a region apart from the second gate line in the first direction, and a second end electrically connected to the source electrode in a region apart from the second gate line in the direction opposite to the first direction.

(4) In any one of the above (1) to (3), the semiconductor device may further include a second guard metal layer between the first gate line and the drain electrode, extending in the first direction, and having at least a portion provided above the source electrode. The second guard metal layer may be electrically connected to the source electrode.

(5) In any one of the above (1) to (4), the semiconductor device may further include an insulating film provided on the substrate so as to cover the source electrode, the drain electrode, the first gate electrode, and the second gate electrode. The first gate line, the second gate line, and the first guard metal layer may be provided on the insulating film.

(6) In the above (5), the semiconductor device may further include a first via line penetrating through the insulating film and electrically connecting the source electrode and the first guard metal layer.

(7) In the above (5) or (6), the semiconductor device may further include a second via line penetrating through the insulating film and electrically connecting the second gate electrode and the second gate line.

(8) In any one of the above (1) to (7), the semiconductor device may further include a source wall having at least a portion that is provided between the second gate electrode and the drain electrode and extends in the first direction. The first guard metal layer may be electrically connected to the source wall outside the source electrode.

(9) In any one of the above (1) to (8), the first gate electrode and the second gate electrode may be apart from each other on an upper surface of the substrate in the first direction.

(10) In any one of the above (1) to (9), in a direction normal to an upper surface of the substrate, the source electrode and the drain electrode may have a thickness larger than a thickness of the first gate electrode and the second gate electrode.

Specific examples of a semiconductor device according to embodiments of the present disclosure will be described below with reference to the drawings. It should be noted that the present disclosure is not limited to these examples, and is defined by the scope of the claims, and is intended to include all modifications within the meaning and scope equivalent to the scope of the claims.

First Embodiment

FIG. 1 is a block diagram of an amplifier using a FET according to a first embodiment. As illustrated in FIG. 1, an amplifier 100 includes an FET 55, an input matching circuit 52 and an output matching circuit 54. A source S of FET 55 is connected to ground. A high-frequency signal input from an input terminal Tin is input to a gate G of FET 55 through input matching circuit 52. The high-frequency signal amplified by FET 55 is outputted from an output terminal Tout through output matching circuit 54. Input matching circuit 52 performs matching so that an input impedance of input terminal Tin and an impedance when input matching circuit 52 is viewed from gate G of FET 55 are complex conjugates. Output matching circuit 54 performs matching so that an output impedance of the output terminal Tout and an impedance when output matching circuit 54 is viewed from a drain D of FET 55 are complex conjugates. Amplifier 100 is, for example, a wireless communication power amplifier for 0.5 GHz to 10 GHz (for example, 3.5 GHz). A power outputted from amplifier 100 is, for example, 30 dBm to 56 dBm.

Figure 2:
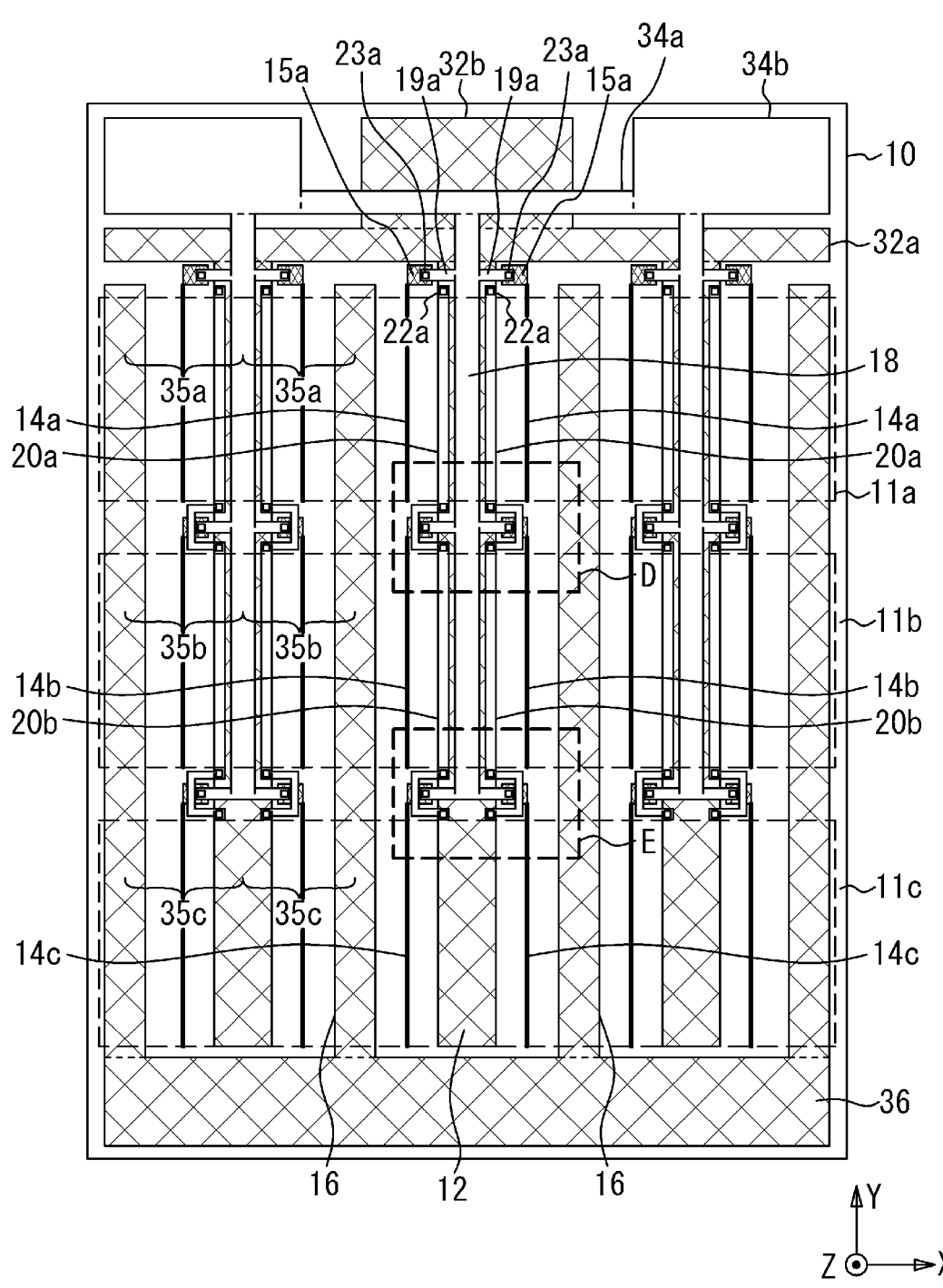
FIG. 2 is a plan view of an FET according to the first embodiment.
Figure 3:
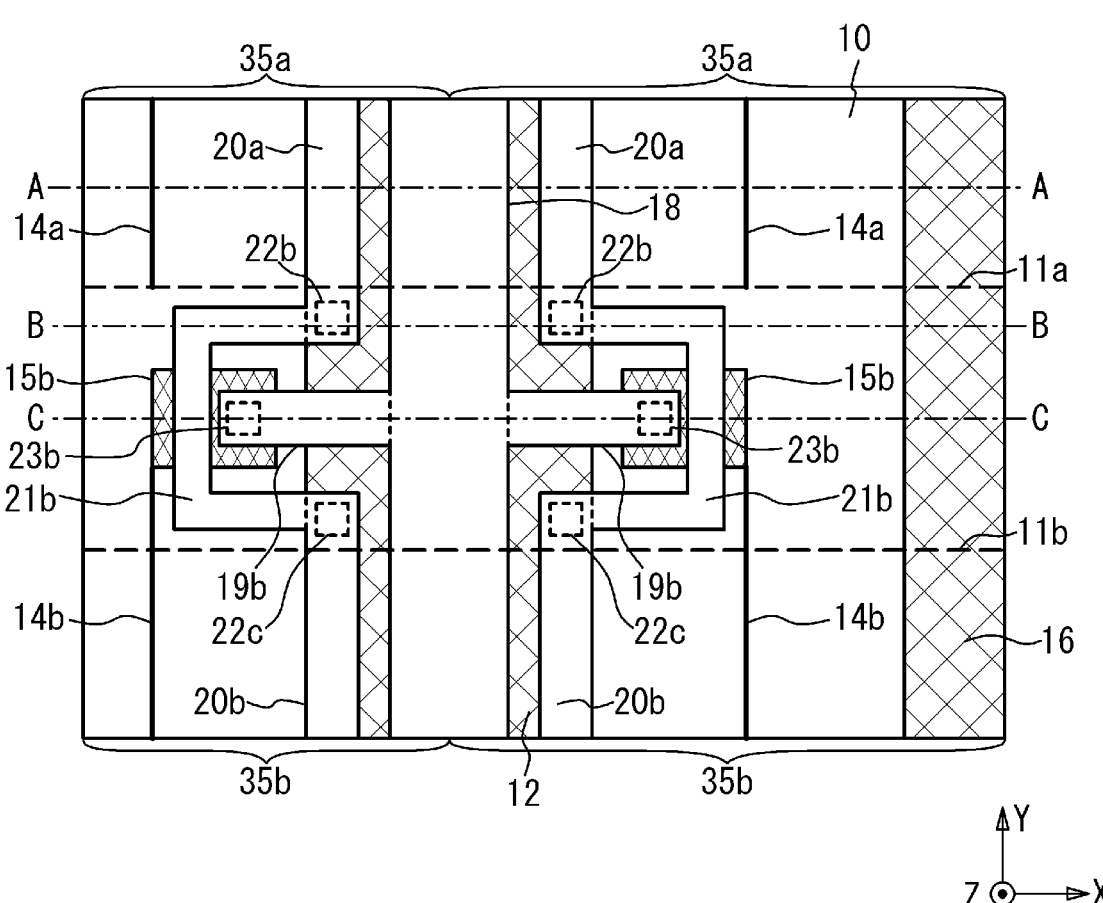
FIG. 3 is an enlarged plan view of a range D in FIG. 2.
Figure 4:
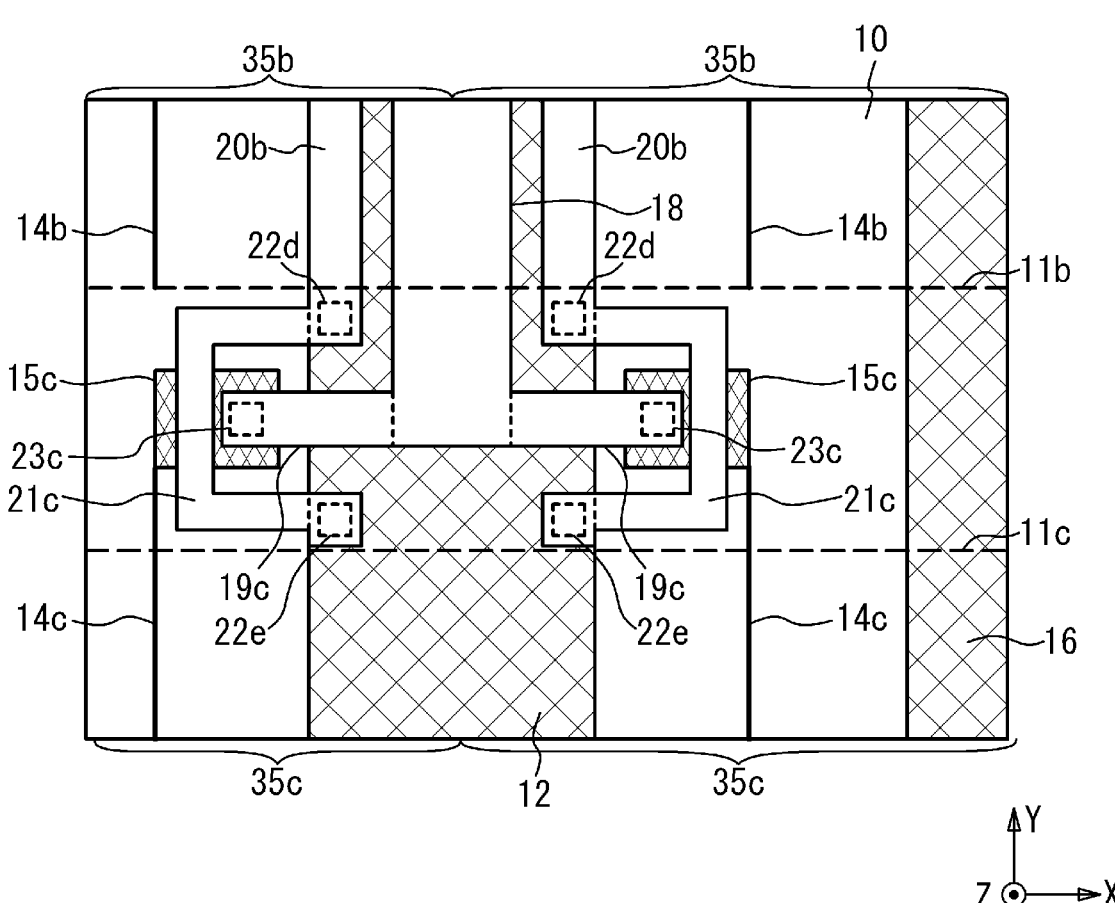
FIG. 4 is an enlarged plan view of a range E in FIG. 2.
Figure 5:
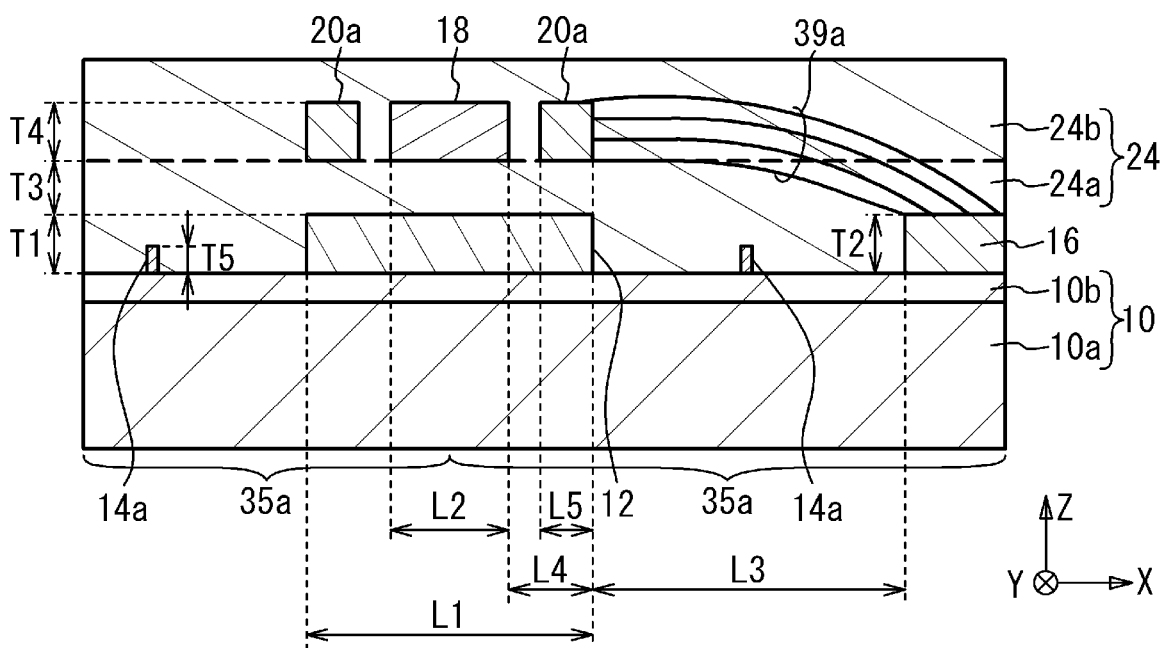
FIG. 5 is a cross-sectional view taken along a line A-A in FIG. 3.
Figure 6:
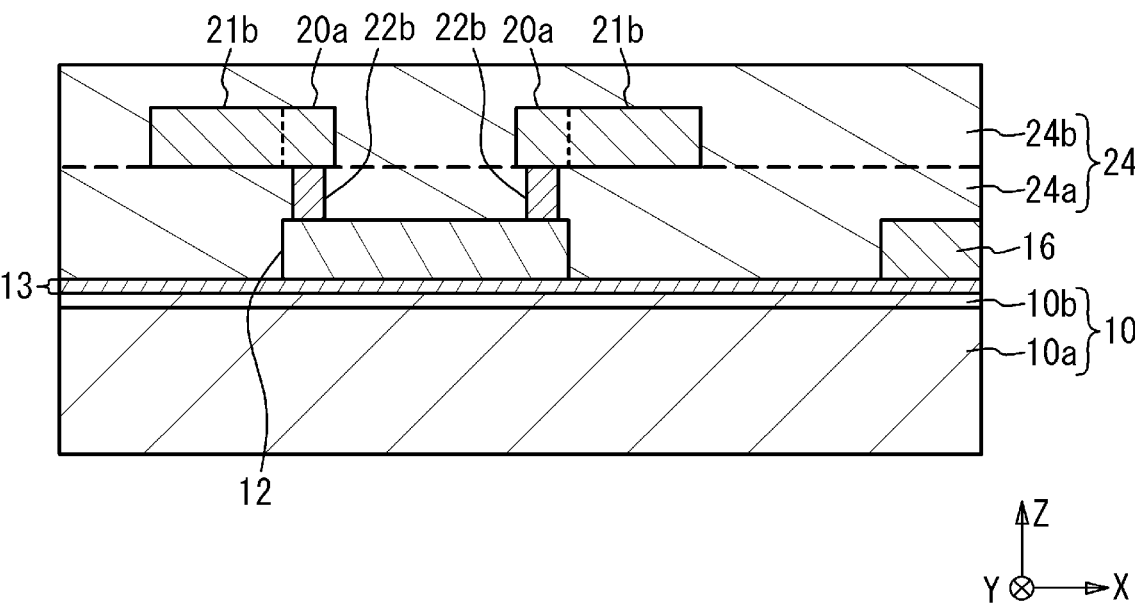
FIG. 6 is a cross-sectional view taken along a line B-B in FIG. 3.
Figure 7:
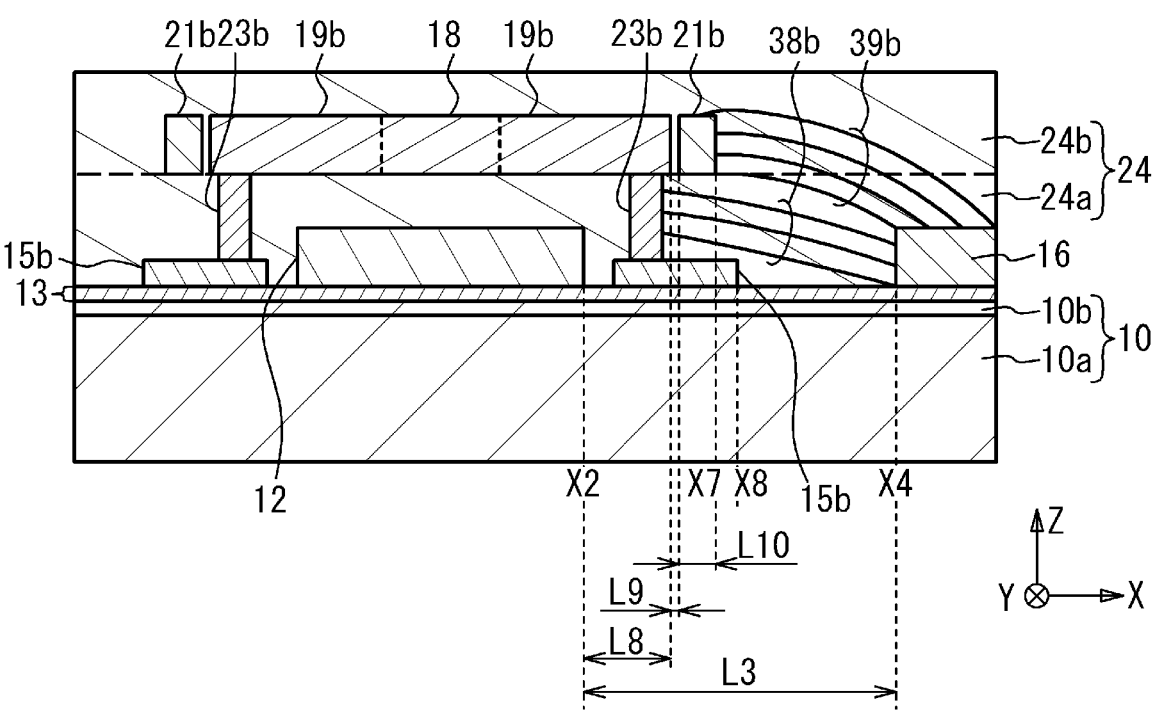
FIG. 7 is a cross-sectional view taken along a line C-C in FIG. 3.

FIG. 2 is a plan view of an FET according to the first embodiment. FIGS. 3 and 4 are enlarged plan views of a range D and a range E in FIG. 2. FIGS. 5 to 7 are cross-sectional views taken along lines A-A, B-B and C-C in FIG. 3, respectively. A direction normal to an upper surface of a substrate 10 is a Z direction, an extending direction of each of the finger-shaped electrodes is a Y direction (first direction), and an arrangement direction of each of the electrodes is an X direction (second direction).

As illustrated in FIGS. 2 to 4, a source electrode 12, gate electrodes 14a, 14b and 14c, a drain electrode 16, gate lines 18, 19a, 19b and 19c, guard metal layers 20a, 20b, 21b and 21c, a source bus bar 32a, a source pad 32b, a gate line 34a, a gate pad 34b and a drain pad 36 are provided on substrate 10.

Active regions 11a, 11b, and 11c are provided in substrate 10. Active regions 11a, 11b, and 11c are arranged in the Y direction and extend in the X direction. A plurality of unit FETs 35a, 35b, and 35c arranged in the X direction are provided in active regions 11a, 11b, and 11c, respectively.

The plurality of source electrodes 12 extend in the Y direction across active regions 11a, 11b, and 11c. The plurality of source electrodes 12 are electrically connected in common to source bus bar 32a at a plus (+) end of each source electrode 12 in the Y direction and are short-circuited. Source bus bar 32a is electrically connected to and short-circuited with source pad 32b. The plurality of drain electrodes 16 extend in the Y direction across active regions 11a, 11b, and 11c. The plurality of drain electrodes 16 are electrically connected in common to drain pad 36 at a minus (−) end of each drain electrode 16 in the Y direction and are short-circuited. The plurality of source electrodes 12 and the plurality of drain electrodes 16 are provided alternately. Between one source electrode 12 and one drain electrode 16, gate electrodes 14a, 14b, and 14c are provided on active regions 11a, 11b, and 11c, respectively. Gate electrode 14b is provided on a − side of gate electrode 14a in the Y direction. Gate electrode 14c is provided on the − side of gate electrode 14b in the Y direction. Source electrode 12, gate electrode 14a, and drain electrode 16 form unit FET 35a, source electrode 12, gate electrode 14b, and drain electrode 16 form unit FET 35b, and source electrode 12, gate electrode 14c, and drain electrode 16 form unit FET 35c.

Pads 15a, 15b, and 15c are provided at the + ends of active regions 11a, 11b, and 11c of gate electrodes 14a, 14b, and 14c in the Y direction, respectively. Pads 15a, 15b, and 15c are metal layers made of the same material as gate electrodes 14a, 14b, and 14c. Gate lines 18, 19a, 19b, and 19c and guard metal layers 20a, 20b, 21b, and 21c are provided above source electrode 12. Gate line 18 extends in the Y direction above source electrode 12, and is electrically connected and short-circuited to gate line 34a or gate pad 34b at the + end in the Y direction. Gate lines 19a, 19b, and 19c electrically connect and short-circuit gate line 18 to pads 15a, 15b, and 15c through via lines 23a, 23b, and 23c, respectively.

Guard metal layers 20a and 20b are provided on both sides of gate line 18 in the X direction above source electrode 12 of active regions 11a and 11b, respectively, and extend in the Y direction. Guard metal layer 20a is electrically connected to source electrode 12 through a via line 22a at the + end in the Y direction and is electrically connected to source electrode 12 through a via line 22b at the − end in the Y direction. Guard metal layer 20b is electrically connected to source electrode 12 through a via line 22c at the + end in the Y direction and is electrically connected to source electrode 12 through a via line 22d at the − end in the Y direction. As a result, guard metal layers 20a and 20b and source electrode 12 are electrically short-circuited, and guard metal layers 20a and 20b and source electrode 12 have substantially the same potential.

Guard metal layer 21b is provided between gate line 19b and drain electrode 16. A first end of guard metal layer 21b is electrically connected to the − end of guard metal layer 20a in the Y direction, and a second end of guard metal layer 21b is electrically connected to the + end of guard metal layer 20b in the Y direction. Guard metal layer 21c is provided between gate line 19c and drain electrode 16. A first end of guard metal layer 21c is electrically connected to the − end of guard metal layer 20b in the Y direction, and a second end of guard metal layer 21c is electrically connected to source electrode 12 through a via line 22e. As a result, guard metal layers 21b and 21c and source electrode 12 are electrically short-circuited, and guard metal layers 21b and 21c and source electrode 12 have substantially the same potential.

As illustrated in FIGS. 5 to 7, substrate 10 includes a substrate 10a and a semiconductor layer 10b provided on substrate 10a. In an XY plane parallel to the X direction and the Y direction, a region of semiconductor layer 10b that is inactivated by ion implantation or the like is an inactive region 13, and regions that are not inactivated are active regions 11a, 11b, and 11c. An insulating film 24a is provided on substrate 10 to cover source electrode 12, drain electrode 16, and gate electrodes 14a, 14b, and 14c. Gate lines 18, 19a, 19b, and 19c, and guard metal layers 20a, 20b, 21b, and 21c are provided on insulating film 24a. Gate lines 18, 19a, 19b, and 19c, and guard metal layers 20a, 20b, 21b, and 21c are formed, for example, in the same manufacturing process, are metal layers made of the same material, and have substantially the same thickness. An insulating film 24b is provided on insulating film 24a to cover gate lines 18, 19a, 19b, and 19c, and guard metal layers 20a, 20b, 21b, and 21c. Insulating films 24a and 24b form an insulating film 24. Via lines 22a, 22b, 22c, 22d, 22e, 23a, 23b, and 23c penetrate through insulating film 24a and extend in the Z direction.

As illustrated in FIGS. 2 to 5, in active regions 11a and 11b, gate line 18 is provided above a central portion of source electrode 12 in the X direction. Guard metal layers 20a and 20b are provided above end portions of source electrode 12 in the X direction.

As illustrated in FIGS. 2 to 4 and 6, when viewed from the + side in the Z direction, guard metal layers 21b extend from guard metal layers 20a and 20b toward the outside of source electrode 12, and guard metal layers 21c extend from guard metal layer 20b and the end portion of source electrode 12 in the X direction toward the outside of source electrode 12. Guard metal layer 20a is electrically connected to source electrode 12 through via lines 22a and 22b, and guard metal layer 20b is electrically connected to source electrode 12 through via lines 22c and 22d.

As illustrated in FIGS. 2 to 4 and 7, when viewed from the + side in the Z direction, gate lines 19b and 19c extend from gate line 18 toward the outside of source electrode 12, and are electrically connected to pads 15b and 15c through via lines 23b and 23c, respectively, outside source electrode 12. Guard metal layers 21b and 21c are provided between gate lines 19b and 19c and drain electrode 16, respectively.

A source potential (for example, a reference potential such as a ground potential) is supplied from source pad 32b and source bus bar 32a to source electrode 12. A gate potential (for example, a high-frequency signal and a gate bias voltage) is supplied from gate pad 34b and gate line 34a to gate electrodes 14a, 14b, and 14c through gate lines 18, 19a, 19b, and 19c. A drain bias voltage is supplied from drain pad 36 to each drain electrode 16. The high-frequency signal amplified in each of unit FETs 35a, 35b, and 35c is output from drain electrode 16 to drain pad 36.

In unit FETs 35a, 35b, and 35c, high-frequency signals are input from the ends of gate electrodes 14a, 14b, and 14c on the + end in the Y direction, respectively. When high-frequency signals are input to gate electrode 14a from both the + end and the − end in the Y direction of gate electrode 14a, the high-frequency characteristics of unit FET 35a are degraded due to a phase difference or the like. The same applies to unit FET 35b. In the first embodiment, the − end of gate electrode 14a in the Y direction and the + end of gate electrode 14b in the Y direction are not connected to each other, and the − end of gate electrode 14b in the Y direction and the + end of gate electrode 14c in the Y direction are not connected to each other, so that deterioration of the high-frequency characteristics in unit FETs 35a and 35b can be suppressed.

When the semiconductor device is, for example, a nitride semiconductor device, substrate 10a is, for example, a SiC substrate, a silicon substrate, a GaN substrate, or a sapphire substrate. Semiconductor layer 10b includes for example, a nitride semiconductor layer such as a GaN layer, an AlGaN layer, and/or an InGaN layer. When the semiconductor device is, for example, a GaAs-based semiconductor device, substrate 10a is, for example, a GaAs substrate. Semiconductor layer 10b includes for example, an arsenide semiconductor layer such as a GaAs layer, an AlGaAs layer and/or an InGaAs layer. Source electrode 12 and drain electrode 16 are metal films and, for example, a titanium film and an aluminum film are stacked in this order from substrate 10. A gold film may be provided on the aluminum film. Gate electrodes 14a, 14b, and 14c, and pads 15a, 15b, and 15c are metal films and, for example, a nickel film and a gold film are stacked in this order from substrate 10. Gate lines 18, 19a, 19b, and 19c, and guard metal layers 20a, 20b, 21b, and 21c are, for example, gold layers, copper layers, or aluminum layers. Via lines 22a, 22b, 22c, 22d, 22e, 23a, 23b, and 23c are metal layers such as gold layers, copper layers, tungsten layers, or aluminum layers. Insulating film 24 is an organic insulating film such as polyimide resin or benzocyclobutene (BCB). Insulating film 24 may be an inorganic insulating film such as a silicon nitride film or a silicon oxide film. A relative dielectric constant of insulating film 24 is, for example, 2.4 to 10.

Referring to FIG. 5, a length L1 of source electrode 12 in the X direction is, for example, 5 μm to 50 μm. A length L2 of gate line 18 in the X direction is, for example, 3 μm to 45

µm. A distance L3 between source electrode 12 and drain electrode 16 in the X direction is, for example, 3 µm to 20 µm. A distance L4 in the X direction between an end of gate line 18 and an end of source electrode 12 is, for example, 1 µm to 10 µm. A length L5 of each of guard metal layers 20a and 20b in the X direction is, for example, 0.5 µm to 3 µm. A thickness T1 of source electrode 12 and a thickness T2 of drain electrode 16 are, for example, 1 µm to 6 µm. A thickness T5 of each of gate electrodes 14a, 14b, and 14c is, for example, 1 µm or less, and is smaller than the thicknesses T1 and T2. A thickness T3 of insulating film 24a between source electrode 12 and gate line 18 is, for example, 0.5 µm to 10 µm. A thickness T4 of each of gate lines 18, 19a, 19b, and 19c, and guard metal layers 20a, 20b, 21b, and 21c is, for example, 0.5 µm to 6 µm.

Referring to FIG. 7, a distance L8 in the X direction between an end of source electrode 12 and each end of gate lines 19a, 19b, and 19c is, for example, 1 µm to 20 µm. Distances L9 between gate line 19b and guard metal layer 21b and between gate line 19c and guard metal layer 21c in the X direction are, for example, 0.2 µm to 5 µm. A length L10 of each of the guard metal layers 21a and 21b in the X direction is, for example, 0.5 µm to 5 µm.

Figure 8:
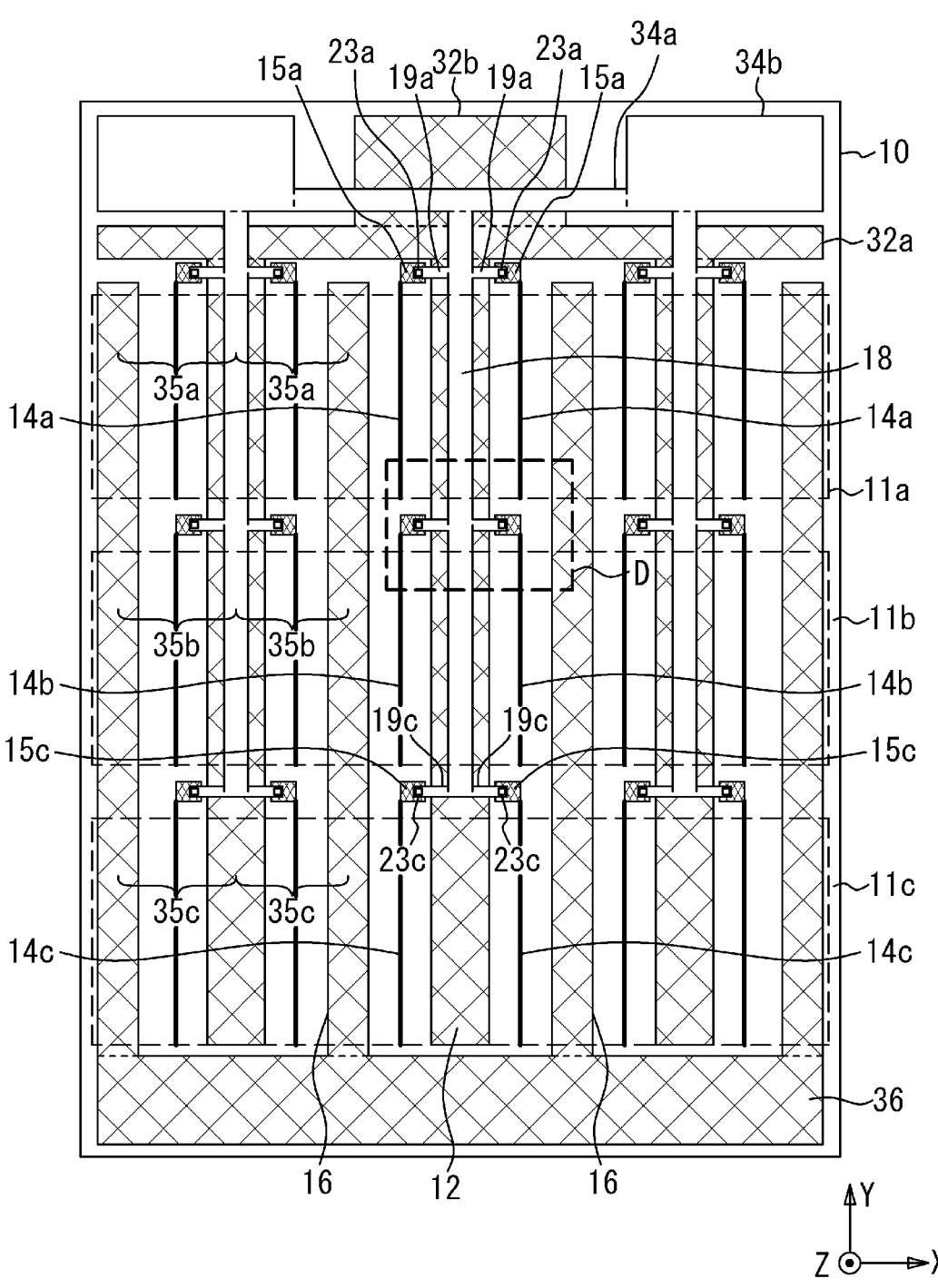
FIG. 8 is a plan view of a semiconductor device according to a first comparative example.
Figure 9:
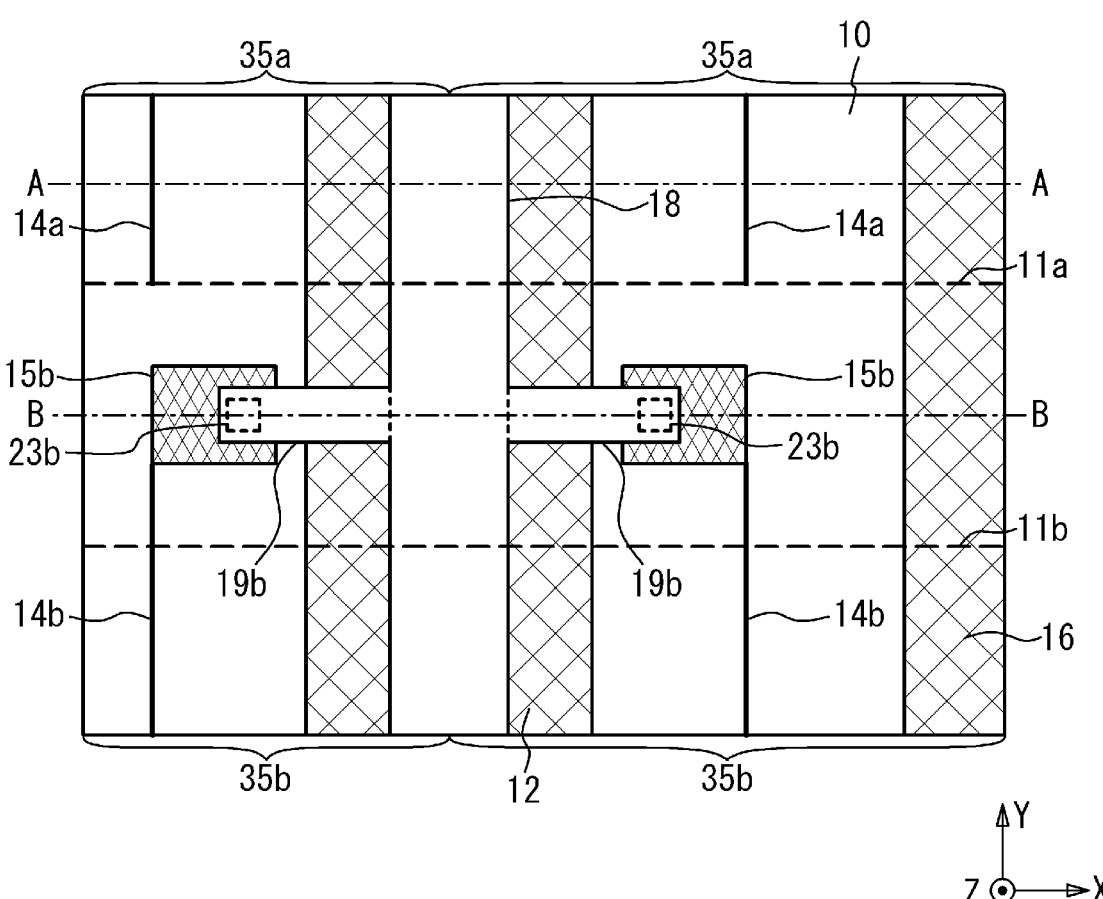
FIG. 9 is an enlarged plan view of a range D in FIG. 8.
Figure 10:
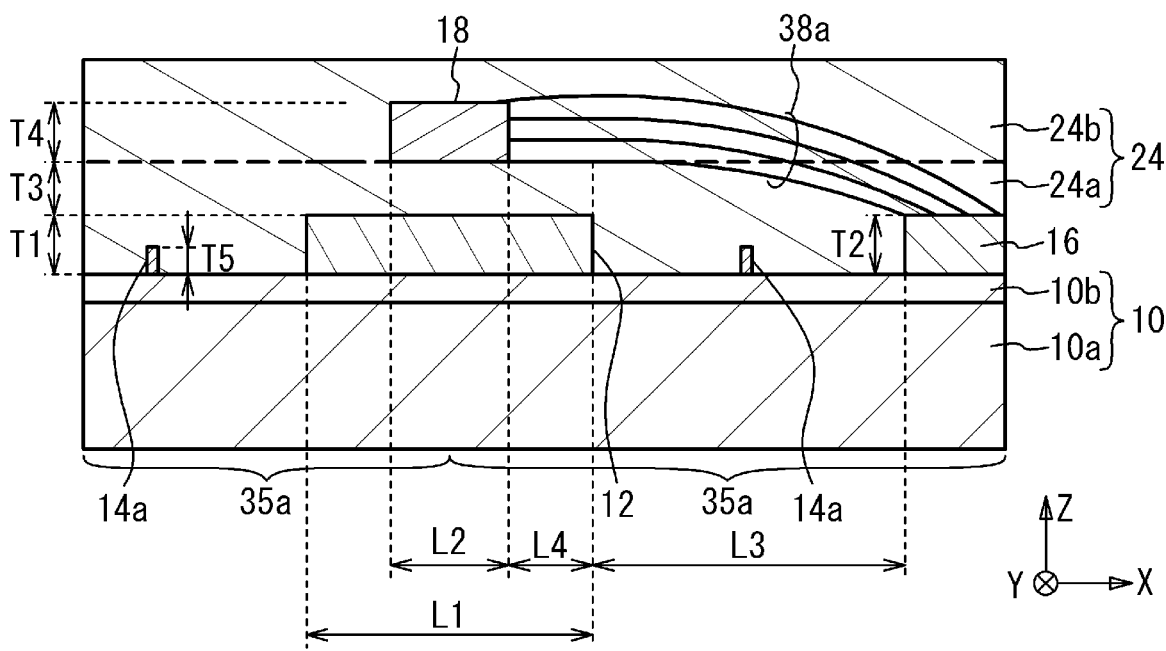
FIG. 10 is a cross-sectional view taken along a line A-A in FIG. 9.
Figure 11:
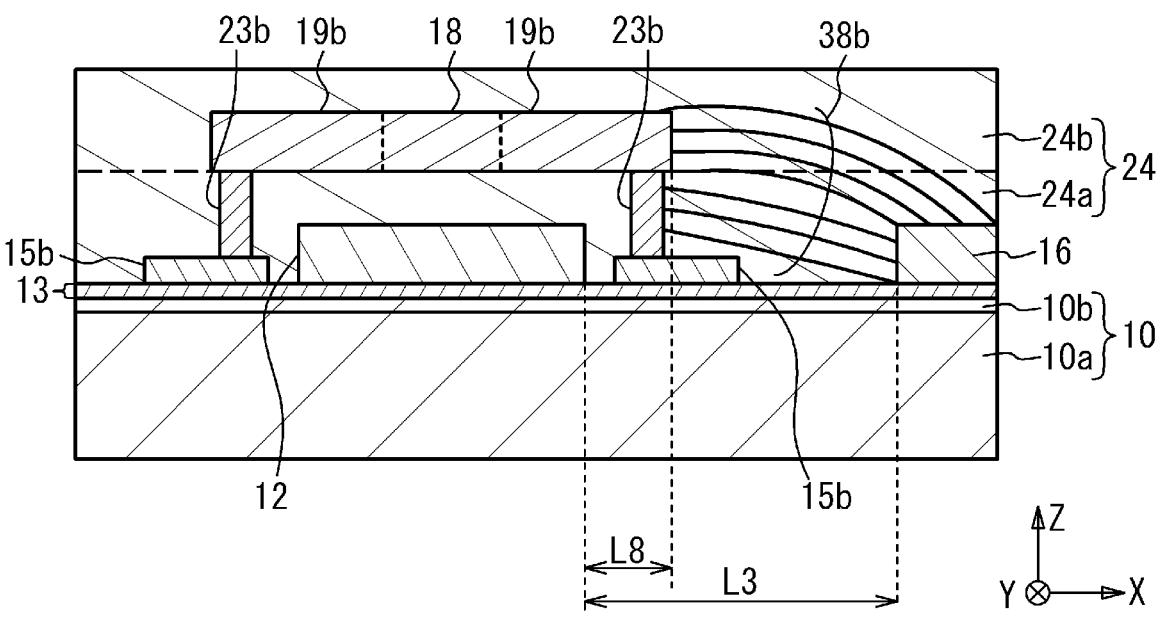
FIG. 11 is a cross-sectional view taken along a line B-B in FIG. 9.

FIG. 8 is a plan view of a semiconductor device according to a first comparative example. FIG. 9 is an enlarged plan view of range D in FIG. 8, and FIGS. 10 and 11 are cross-sectional views taken along lines A-A and B-B in FIG. 9, respectively. As illustrated in FIGS. 8 to 11, in the first comparative example, guard metal layers 20a, 20b, 21b, 21c, and via lines 22a, 22b, 22c, 22d, 22e are not provided. Other configurations are the same as those of the first embodiment, and a description thereof is omitted.

In the first comparative example, as illustrated in FIG. 10, in active region 11a, electric lines of force 38a extend between gate line 18 and drain electrode 16, and gate line 18 and drain electrode 16 are in electric field coupling. Accordingly, a parasitic capacitance Cp_gda is generated between gate line 18 and drain electrode 16.

As illustrated in FIG. 11, between active regions 11a and 11b, electric lines of force 38b extend between gate line 19b and via line 23b, and drain electrode 16, and gate line 19b and via line 23b are in electric field coupling with drain electrode 16. As a result, a parasitic capacitance Cp_gdb is generated between gate line 19b and via line 23b and drain electrode 16.

A maximum oscillation frequency fmax of the FET is expressed by the following Formula 1.

$$fmax \sim \sqrt{(ft/(8\pi RgCgd))} \qquad \text{Formula 1}$$

Where ft is a cutoff frequency, Rg is the gate resistance and Cgd is a gate-drain capacitance. When the parasitic capacitances Cp_gda and Cp_gdb increase, Cgd increases and fmax decreases.

In order to reduce the parasitic capacitances Cp_gda and Cp_gdb, it is conceivable to reduce a relative dielectric constant εr of insulating film 24. However, when εr is reduced, the function of insulating film 24 as a protective film is reduced, and the moisture resistance, the dust resistance, or the like is reduced.

In order to reduce parasitic capacitance Cp_gda, it is conceivable to increase L3+L4 corresponding to the distance between gate line 18 and drain electrode 16. When length L2 of gate line 18 is reduced, the gate resistance increases. Therefore, in order to increase L3+L4, it is conceivable to increase length L1 of source electrode 12. However, an area of the FET is increased and the semiconductor device is increased in size.

In order to reduce parasitic capacitance Cp_gdb, it is conceivable to increase the distance between gate line 19b and drain electrode 16. However, in order to electrically connect gate line 19b to pad 15b, an end portion of gate line 19b is positioned between source electrode 12 and drain electrode 16 in the X direction. Therefore, when the distance between gate line 19b and drain electrode 16 is increased, distance L3 between source electrode 12 and drain electrode 16 is increased. When distance L3 is changed, the characteristics of unit FET 35a are changed, so that distance L3 cannot be changed. Thus, it is difficult to increase the distance between gate line 19b and drain electrode 16.

In the first embodiment, as illustrated in FIG. 7, guard metal layer 21b short-circuited to source electrode 12 is provided on the side of gate line 19b. Thus, electric lines of force 38b (refer to FIG. 11 of the first comparative example) connecting between gate line 19b and drain electrode 16 are cut off by guard metal layer 21b. Although electric lines of force 38b connecting between via line 23b and drain electrode 16 are not cut off, parasitic capacitance Cp_gdb can be suppressed as compared with the first comparative example. Instead of electric lines of force 38b cut off by guard metal layer 21b, electric lines of force 39b connecting between guard metal layer 21b and drain electrode 16 are generated. Accordingly, a parasitic capacitance Cp_dsb between source electrode 12 and drain electrode 16 is generated, and a drain-source capacitance Cds increases. However, as indicated by Equation 1, Cds does not significantly affect fmax. A gate-source capacitance Cgs greatly affects ft in Equation 1 due to the Miller effect, whereas drain-source capacitance Cds does not significantly affect ft either. Therefore, even when drain-source capacitance Cds is increased in the first embodiment, the influence on the characteristics of the FET is small, and the gate-drain capacitance Cgd can be reduced, so that the FET characteristics such as fmax can be improved.

According to the first embodiment, gate electrode 14a (first gate electrode) extends in the Y direction (first direction) and is provided on substrate 10 between source electrode 12 and drain electrode 16. Gate electrode 14b (second gate electrode) extends in the Y direction and is provided on a region of substrate 10 located in the − direction in the Y direction from gate electrode 14a between source electrode 12 and drain electrode 16. Gate electrode 14a is disposed between gate pad 34b and gate electrode 14b. Gate line 18 (first gate line) is provided above source electrode 12 opposite to substrate 10 and extends in the Y direction. Gate line 19b (second gate line) is provided above source electrode 12 opposite to substrate 10, extends in the X direction (second direction crossing the first direction), has a first end connected to gate line 18, and has a second end (opposite to the first end) electrically connected to gate electrode 14b outside source electrode 12. In this way, gate electrode 14b is electrically connected to gate pad 34b by gate lines 18 and 19b.

In such a structure, as illustrated in FIGS. 3, 4 and 7, guard metal layers 21b and 21c (first guard metal layers) are provided between gate lines 19b and 19c and drain electrode 16, respectively, and at least portions of guard metal layers 21b and 21c are provided between drain electrode 16 and source electrode 12, and are electrically connected to source electrode 12. Thereby, as described in FIG. 7, guard metal layer 21b can cut off electric lines of force 38b between gate line 19b and drain electrode 16. Accordingly, parasitic capacitance Cp_gdb can be reduced, so that characteristics such as fmax of the FET can be improved.

As illustrated in FIGS. 3 and 4, guard metal layers 21*b* and 21*c* are provided so as to surround portions of gate lines 19*b* and 19*c* located outside source electrode 12 from the + direction (first direction) in the Y direction, the − direction (opposite direction to the first direction) in the Y direction, and the + direction (second direction) in the X direction. Accordingly, as illustrated in FIG. 7, guard metal layers 21*b* and 21*c* can cut off electric lines of force 38*b* extending from the + direction and the − direction of the Y direction of gate lines 19*b* and 19*c* to drain electrode 16. Thus, parasitic capacitance Cp_gdb can be further reduced, so that the characteristics of the FET can be further improved.

As illustrated in FIGS. 3 and 4, the first ends of guard metal layers 21*b* and 21*c* are electrically connected to source electrode 12 through via lines 22*b* and 22*d*, respectively, in regions apart from gate lines 19*b* and 19*c*, respectively, in the + direction of the Y direction (first direction). The second ends of guard metal layers 21*b* and 21*c* are electrically connected to source electrode 12 through via lines 22*c* and 22*e*, respectively, in regions apart from gate lines 19*b* and 19*c*, respectively, in the − direction of the Y direction (the direction opposite to the first direction). Thus, guard metal layers 21*b* and 21*c* can be connected to the potential of source electrode 12 (for example, the ground potential) at both ends of guard metal layers 21*b* and 21*c*. Therefore, the cutoff effect of guard metal layers 21*b* and 21*c* can be further increased.

As illustrated in FIG. 7, an end X7 of guard metal layer 21*b* closer to drain electrode 16 may be located closer to source electrode 12 than an end X4 of drain electrode 16 closer to source electrode 12. However, when the end X7 is too close to drain electrode 16, parasitic capacitance Cp_ds increases. From this point of view, the end X7 of guard metal layer 21*b* can be closer to source electrode 12 than the midpoint between the end X2 of source electrode 12 and the end X4 of drain electrode 16. In addition, the end X7 of guard metal layer 21*b* can be closer to source electrode 12 than an end X8 of pad 15*b* closer to drain electrode 16. When distance L9 between gate line 19*b* and guard metal layer 21*b* is small, a parasitic capacitance Cp_gs is increased. From this point of view, distance L9 can be set to ½ times or more a width L10 of guard metal layer 21*b*, and can be set to one time or more.

As illustrated in FIGS. 2 to 5, guard metal layers 20*a* and 20*b* (second guard metal layers) are provided between gate line 18 and drain electrode 16, extend in the Y direction, and at least portions thereof are provided above source electrode 12, and are electrically connected to source electrode 12. Accordingly, as described in FIG. 5, guard metal layer 20*a* can cut off electric lines of force 38*a* (refer to FIG. 10 of the first comparative example) between gate line 18 and drain electrode 16. Therefore, since parasitic capacitance Cp_gda can be reduced, the characteristics such as fmax of the FET can be improved. Instead of electric lines of force 38*a* cut off by guard metal layer 20*a*, electric lines of force 39*a* connecting between guard metal layer 20*a* and drain electrode 16 are generated. Accordingly, parasitic capacitance Cp_dsb between source electrode 12 and drain electrode 16 is generated, and drain-source capacitance Cds increases. However, as indicated in Formula 1, Cds does not significantly affect fmax.

Insulating film 24*a* is provided so as to cover source electrode 12, drain electrode 16, and gate electrodes 14*a*, 14*b*, and 14*c*. Gate line 18, gate lines 19*a*, 19*b*, and 19*c*, and guard metal layers 20*a*, 20*b*, 21*b*, and 21*c* are provided on insulating film 24*a*. Thus, moisture resistance, dust resistance, and the like of unit FETs 35*a*, 35*b*, and 35*c* can be improved. Since insulating film 24*a* has a dielectric constant higher than that of air, parasitic capacitances Cp_gda and Cp_gdb between gate lines 18, 19*b* and 19*c* and drain electrode 16 are increased. Therefore, guard metal layers 20*a*, 20*b*, 21*b*, and 21*c* can be provided.

Via lines 22*b* and 22*c* (first via lines) penetrate insulating film 24*a* and electrically connect source electrode 12 and guard metal layer 21*b*. Via lines 22*d* and 22*e* penetrate through insulating film 24*a* and electrically connect source electrode 12 and guard metal layer 21*c*. This allows guard metal layers 21*b* and 21*c* to have the same potential as that of source electrode 12.

Via line 23*b* (second via line) penetrates through insulating film 24*a* and electrically connects the end portion of gate electrode 14*b* and gate line 19*b*. Via line 23*c* penetrates through insulating film 24*a* and electrically connects the end portion of gate electrode 14*c* and gate line 19*c*. Thus, between source electrode 12 and drain electrode 16, gate electrodes 14*b* and 14*c* can be electrically connected to gate lines 19*b* and 19*c*, respectively.

Gate electrodes 14*a* and 14*b* are apart from each other on the upper surface of substrate 10, and gate electrodes 14*b* and 14*c* are apart from each other on the upper surface of substrate 10. Thus, the interference between gate electrodes 14*a* and 14*b* and the interference between gate electrodes 14*b* and 14*c* can be suppressed, and the high-frequency characteristics can be improved. Gate electrodes 14*a* and 14*b* may be connected on the upper surface of substrate 10, and gate electrodes 14*b* and 14*c* may be connected on the upper surface of substrate 10.

Source electrode 12 and drain electrode 16 are thicker than gate electrodes 14*a*, 14*b* and 14*c*. In this case, the parasitic capacitance due to the electric field coupling between gate electrodes 14*a*, 14*b*, and 14*c* and drain electrode 16 is small, and a parasitic capacitance Cp_gd due to the electric field coupling between gate line 18 and drain electrode 16 in the first comparative example becomes a problem. Therefore, guard metal layers 20*a* and 20*b* can be provided.

[First Modification 1 of First Embodiment]

Figure 12:
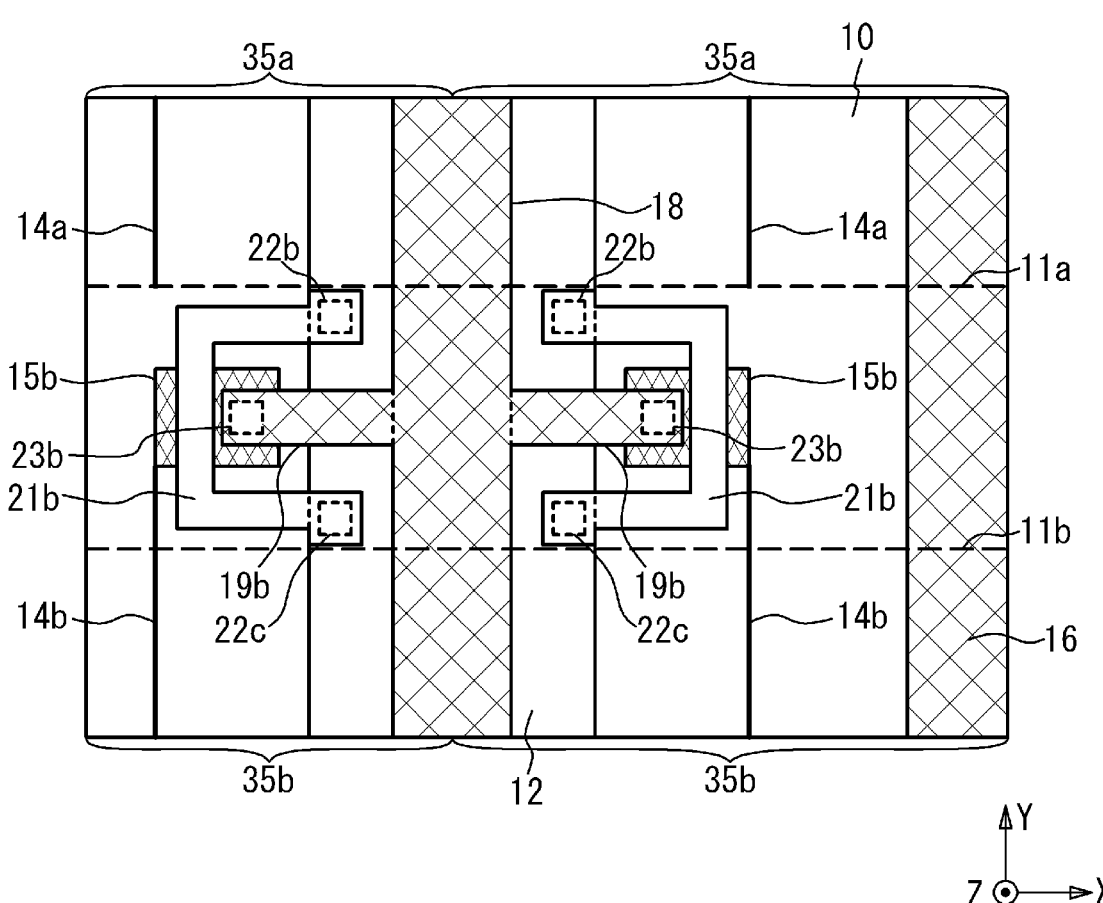
FIG. 12 is an enlarged plan view of a semiconductor device according to a first modification of the first embodiment.

FIG. 12 is an enlarged plan view of a semiconductor device according to a first modification of the first embodiment. FIG. 12 corresponds to the enlarged plan view of range D of FIG. 2. As illustrated in FIG. 12, in the first modification 1 of the first embodiment, guard metal layers 20*a* or 20*b* are not provided. Other configurations are the same as those of the first embodiment, and a description thereof is omitted. Gate line 19*b* (and 19*c*) is closer to drain electrode 16 than gate line 18. Therefore, parasitic capacitance Cp_gdb between gate line 19*b* (and 19*c*) and drain electrode 16 may be more problematic than parasitic capacitance Cp_gda between gate line 18 and drain electrode 16. In such a case, guard metal layers 20*a* or 20*b* may not be provided as in the first modification of the first embodiment, but guard metal layer 21*b* may be provided.

[Second Modification 2 of First Embodiment]

Figure 13:
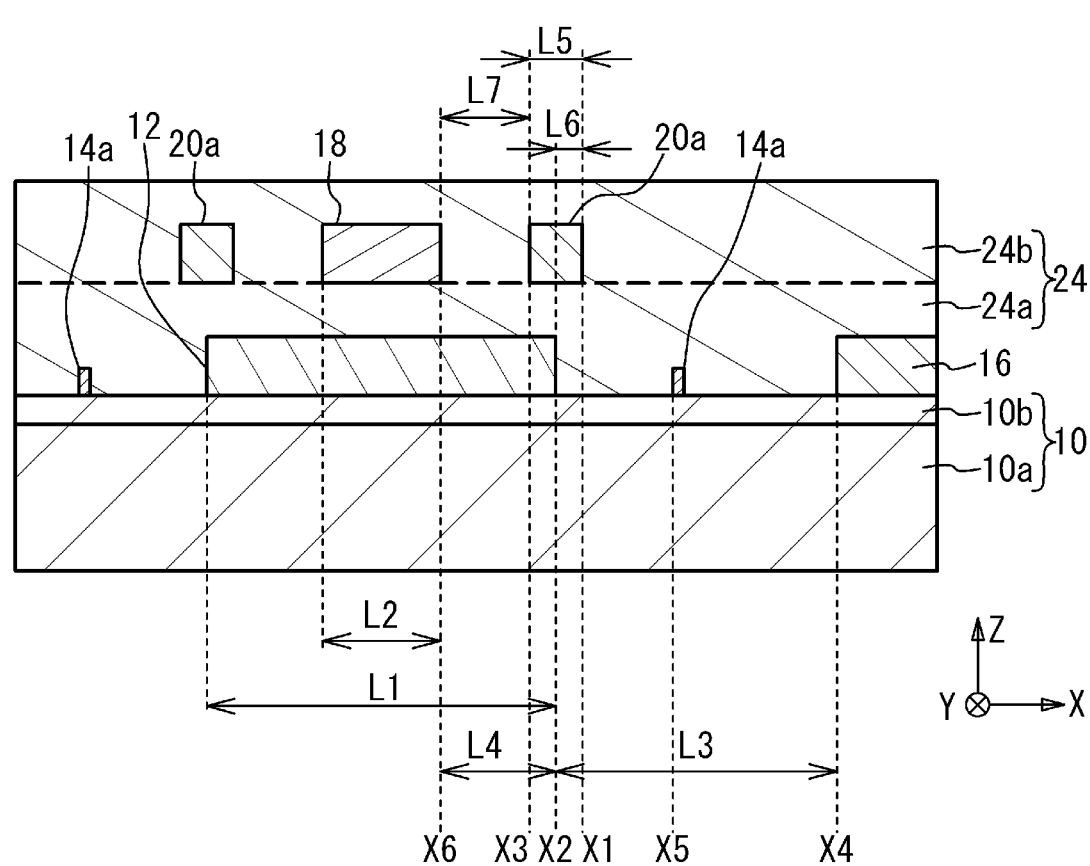
FIG. 13 is a cross-sectional view of a semiconductor device according to a second modification of the first embodiment.

FIG. 13 is a cross-sectional view of a semiconductor device according to a second modification of the first embodiment. FIG. 13 illustrates a modification of a cross section corresponding to the A-A cross section of FIG. 3 of the first embodiment. As illustrated in FIG. 13, an end X1 of guard metal layer 20*a* closer to drain electrode 16 may be closer to drain electrode 16 than the end X2 of source electrode 12 closer to drain electrode 16. The end X1 of guard metal layer 20*a* closer to drain electrode 16 may be located closer to source electrode 12 than the end X4 of drain electrode 16 closer to source electrode 12. However, when the end X1 is too close to drain electrode 16, parasitic capacitances Cp_gs and Cp_ds increase. From this point of view, the end X1 of guard metal layer 20a closer to drain electrode 16 may coincide with an end X5 of gate electrode 14a closer to source electrode 12 or may be located closer to gate line 18 than the end X5, may coincide with a middle point between the end X2 and the end X5 or may be located closer to source electrode 12 than the middle point between the end X2 and the end X5, and may coincide with the end X2 of source electrode 12 closer to drain electrode 16 or may be located closer to gate line 18 than the end X2. A distance L6 in the X direction between the end X2 and the end X1 is, for example, 0 μm to 5 μm.

An end X3 of guard metal layer 20a closer to gate line 18 may be closer to drain electrode 16 than an end X6 of gate line 18 closer to drain electrode 16. However, when the end X3 is too close to gate line 18, parasitic capacitance Cp_gs increases. From this point of view, a distance L7 between the end X3 of guard metal layer 20a closer to gate line 18 and the end X6 of gate line 18 closer to drain electrode 16 may be set to ⅓ or more of distance L4, and may be set to ½ or more. When distance L7 is too large, the overlap between guard metal layer 20a and source electrode 12 becomes small, and it becomes difficult to electrically connect guard metal layer 20a and source electrode 12 through via line 22a. From this point of view, distance L7 may be made smaller than distance L4, and may be made ⅔ or less of distance L4. Other configurations are the same as those of the first embodiment, and a description thereof is omitted.

Second Embodiment

Figure 14:
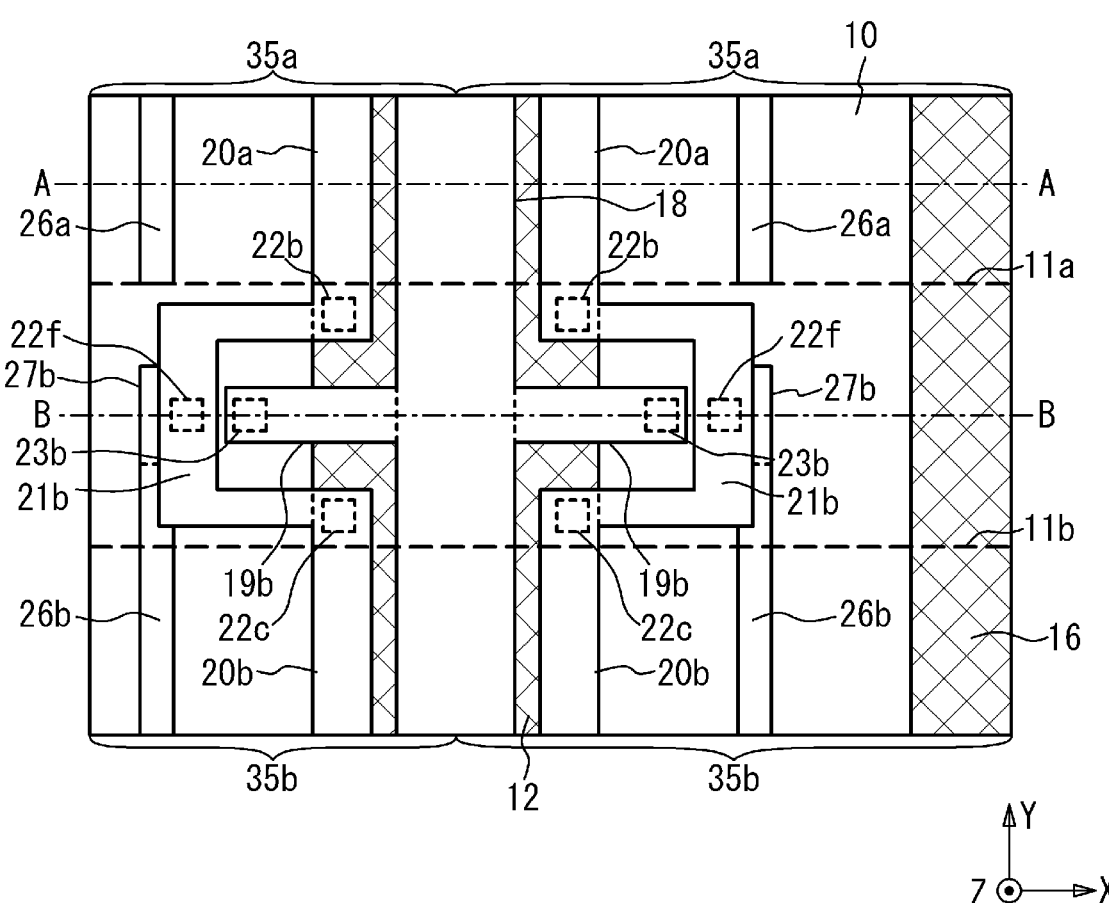
FIG. 14 is a plan view of an FET according to a second embodiment.
Figure 15:
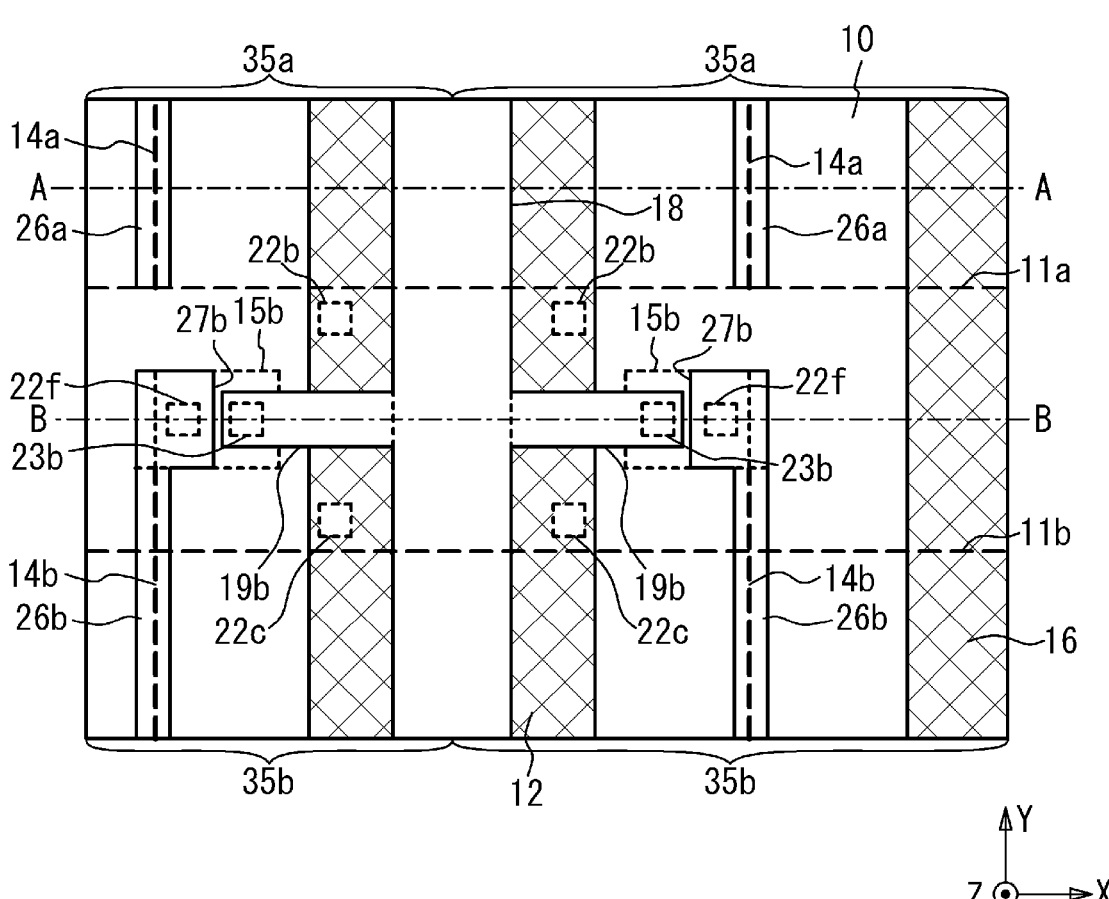
FIG. 15 is a plan view of an FET according to the second embodiment.
Figure 16:
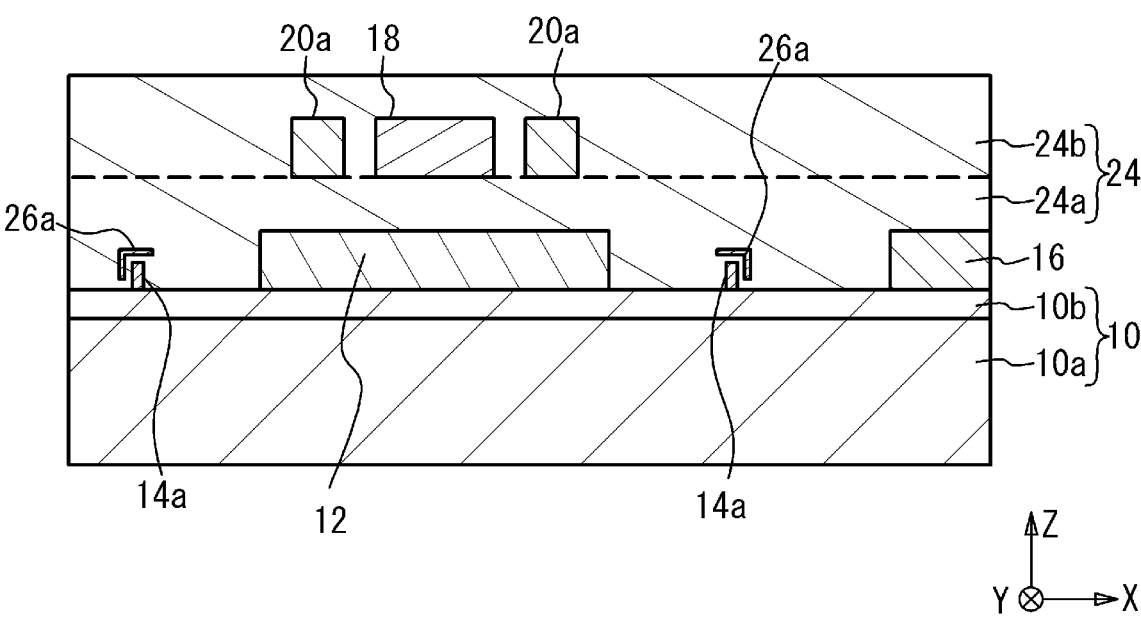
FIG. 16 is a cross-sectional view taken along lines A-A in FIGS. 14 and 15.
Figure 17:
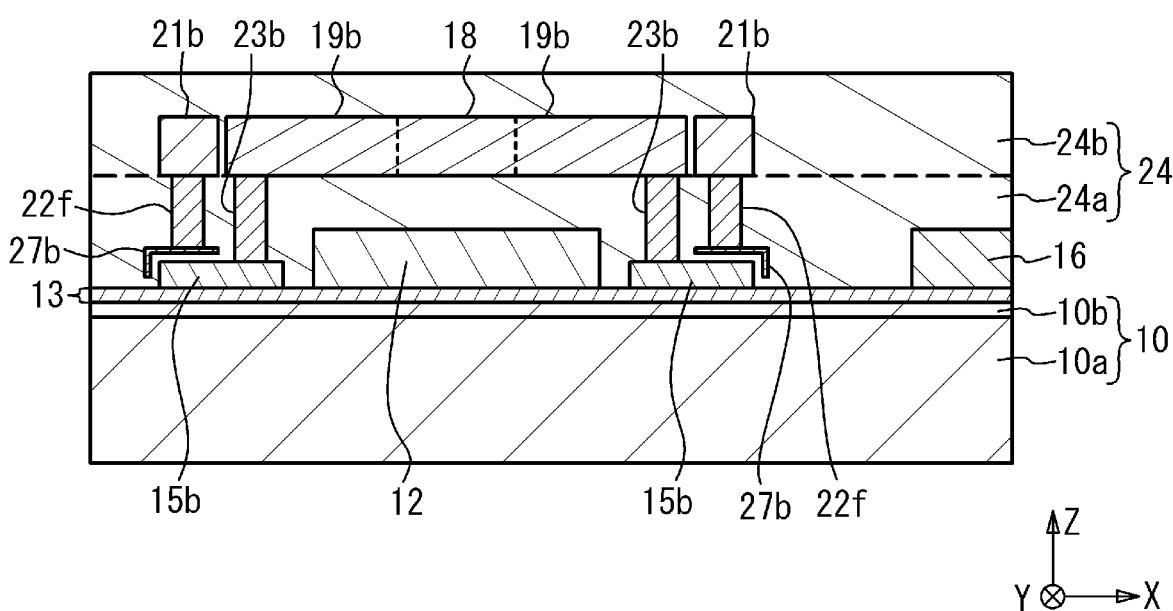
FIG. 17 is a cross-sectional view taken along lines B-B in FIGS. 14 and 15.

FIGS. 14 and 15 are plan views of an FET according to a second embodiment. In FIG. 14, gate electrodes 14a, 14b, or pad 15b are not illustrated, and in FIG. 15, guard metal layers 20a, 20b, or 21b are not illustrated, and gate electrodes 14a, 14b, and pad 15b are indicated by dotted lines. FIGS. 16 and 17 are cross-sectional views taken along lines A-A and B-B in FIGS. 14 and 15, respectively.

As illustrated in FIGS. 14 to 17, source walls 26a and 26b are provided from above gate electrodes 14a and 14b toward drain electrode 16, respectively. Insulating films 24a are provided between source walls 26a and 26b and gate electrodes 14a and 14b, and between source walls 26a and 26b and substrate 10. Source wall 26b is electrically connected to a pad 27b above inactive region 13 at the + end in the Y direction. Pad 27b is provided above pad 15b, and insulating film 24a is provided between pads 27b and 15b.

A via line 22f penetrating through insulating film 24a electrically connects and short-circuits guard metal layer 21b and pad 27b. Thus, source walls 26a and 26b have the same potential as source electrode 12. Source walls 26a and 26b are provided to suppress the gate-drain parasitic capacitances between gate electrodes 14a and 14b and drain electrode 16. At least portions of source walls 26a and 26b may be provided between gate electrodes 14a and 14b and drain electrode 16. Other configurations are the same as those of the first embodiment, and a description thereof is omitted.

According to the second embodiment, at least a portion of source wall 26b is provided between gate electrode 14b and drain electrode 16 and extends in the Y direction. Guard metal layer 21b is electrically connected to source wall 26b through via line 22f (third via line) outside source electrode 12. Thus, source wall 26b and source electrode 12 can be electrically connected to each other without using a new line. Therefore, the semiconductor device can be miniaturized.

As illustrated in FIG. 16, since gate electrodes 14a and 14b are thinner than source electrode 12 and drain electrode 16, the upper surfaces of source walls 26a and 26b are lower than the upper surfaces of source electrode 12 and drain electrode 16. Therefore, even when source walls 26a and 26b are provided, it is difficult to suppress parasitic capacitance Cp_gd between gate line 18 and drain electrode 16. Therefore, guard metal layers 20a and 20b may be provided. In the first and the second modifications of the first embodiment, source wall 26b, pad 27b, and via line 22f may be provided.

In the first embodiment, the Modifications thereof, and the second embodiment, examples in which six unit FETs 35a, 35b, and 35c are arranged in the X direction has been described. However, the number of unit FETs 35a, 35b, and 35c in the X direction may be freely designed. Although an example in which three unit FETs 35a, 35b, and 35c are arranged in the Y direction has been described, the number of unit FETs 35a, 35b, and 35c in the Y direction may be freely designed to be two or more.

In addition, a via penetrating through substrate 10 in the Z direction may be provided, and source electrode 12 may be electrically connected to a metal layer provided on a lower surface of substrate 10 through the via. By supplying the reference potential to the metal layer, the potentials of source electrode 12 and guard metal layers 20a, 20b, 21b, and 21c can be set to the ground potential.

It should be understood that the embodiments disclosed herein are illustrative in all respects and are not restrictive. The scope of the present disclosure is defined by the scope of the claims rather than by the foregoing description, and is intended to include all modifications within the meaning and scope equivalent to the scope of the claims.

What is claimed is:

1. A semiconductor device comprising:
   a substrate;
   a source electrode extending in a first direction and provided on the substrate;
   a drain electrode extending in the first direction and provided on the substrate;
   a first gate electrode extending in the first direction and provided on the substrate between the source electrode and the drain electrode;
   a second gate electrode extending in the first direction and provided in a region on the substrate that is between the source electrode and the drain electrode and that is positioned in the first direction from the first gate electrode;
   a gate pad provided so as to dispose the first gate electrode between the gate pad and the second gate electrode, and electrically connected to the first gate electrode;
   a first gate line provided above the source electrode and opposite to the substrate with respect to the source electrode, and extending in the first direction;
   a second gate line provided above the source electrode, extending in a second direction that crosses the first direction, having a first end connected to the first gate line, and having a second end opposite to the first end, the second end being electrically connected to the second gate electrode outside the source electrode; and
   a first guard metal layer provided between the second gate line and the drain electrode, and having at least a portion provided between the drain electrode and the source electrode, the first guard metal layer being electrically connected to the source electrode.

2. The semiconductor device according to claim 1, wherein the first guard metal layer is provided so as to surround a portion of the second gate line positioned outside the source electrode from the first direction, a direction opposite to the first direction, and the second direction.

3. The semiconductor device according to claim 2, wherein the first guard metal layer has a first end electrically connected to the source electrode in a region apart from the second gate line in the first direction, and a second end electrically connected to the source electrode in a region apart from the second gate line in the direction opposite to the first direction.

4. The semiconductor device according to claim 1, further comprising:

a second guard metal layer provided between the first gate line and the drain electrode, extending in the first direction, and having at least a portion provided above the source electrode, the second guard metal layer being electrically connected to the source electrode.

5. The semiconductor device according to claim 1, further comprising:

an insulating film provided on the substrate so as to cover the source electrode, the drain electrode, the first gate electrode, and the second gate electrode, wherein the first gate line, the second gate line, and the first guard metal layer are provided on the insulating film.

6. The semiconductor device according to claim 5, further comprising:

a first via line penetrating through the insulating film and electrically connecting the source electrode and the first guard metal layer.

7. The semiconductor device according to claim 5, further comprising:

a second via line penetrating through the insulating film and electrically connecting the second gate electrode and the second gate line.

8. The semiconductor device according to claim 1, further comprising:

a source wall having at least a portion that is provided between the second gate electrode and the drain electrode and extends in the first direction, wherein the first guard metal layer is electrically connected to the source wall outside the source electrode.

9. The semiconductor device according to claim 1, wherein the first gate electrode and the second gate electrode are apart from each other on an upper surface of the substrate in the first direction.

10. The semiconductor device according to claim 1, wherein in a direction normal to an upper surface of the substrate, the source electrode and the drain electrode have a thickness larger than a thickness of the first gate electrode and the second gate electrode.

* * * * *